(12) United States Patent
Inukai

(10) Patent No.: US 9,488,944 B2
(45) Date of Patent: Nov. 8, 2016

(54) POWER SAVING POWER SUPPLY SYSTEM HAVING A LOW-CAPACITY POWER SUPPLY CIRCUIT FOR USE IN AN IMAGE FORMING APPARATUS

(71) Applicant: BROTHER KOGYO KABUSHIKI KAISHA, Nagoya-shi, Aichi-ken (JP)

(72) Inventor: Katsumi Inukai, Iwakura (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 496 days.

(21) Appl. No.: 13/629,545

(22) Filed: Sep. 27, 2012

(65) Prior Publication Data

US 2013/0111237 A1    May 2, 2013

(30) Foreign Application Priority Data

Nov. 2, 2011    (JP) ................................. 2011-241367

(51) Int. Cl.
*G06F 1/32*    (2006.01)
*G03G 15/00*    (2006.01)
(Continued)

(52) U.S. Cl.
CPC .......... *G03G 15/5004* (2013.01); *G03G 15/80* (2013.01); *H02M 7/06* (2013.01); *G01R 19/175* (2013.01); *G06F 1/3284* (2013.01);
(Continued)

(58) Field of Classification Search
CPC ................. Y02B 70/1491; H02M 2001/0006; H02M 2001/0032; H02M 2001/0048; H02M 2001/007; H02M 7/00; H02M 1/083; G06F 1/32; G06F 1/28; H03K 5/1536; G03G 15/5004
USPC ........................................................ 713/320
See application file for complete search history.

(56) References Cited

U.S. PATENT DOCUMENTS 5,166,549 A    11/1992    DeDoncker
5,914,538 A    6/1999    Kurosawa et al.
(Continued)

FOREIGN PATENT DOCUMENTS

CN    1534403 A    10/2004
CN    101114152 A    1/2008
(Continued)

OTHER PUBLICATIONS

Extended European Search Report issued in EP 12186338.5, mailed Apr. 16, 2014.
(Continued)

*Primary Examiner* — Thomas Lee
*Assistant Examiner* — Danny Chan
(74) *Attorney, Agent, or Firm* — Merchant & Gould P.C.

(57) ABSTRACT

A power supply system comprises: a switching power supply for generating a DC voltage by rectifying and smoothing an AC voltage of an AC power supply; a control device switching the switching power supply between the normal mode and a power saving mode; and a low-capacity power supply circuit supplying electric power to the control device in the power saving mode. The low-capacity power supply circuit includes: two capacitors, each including one end connected to the AC power supply; a rectifier circuit that is electrically connected between the other ends of the capacitors, and rectifies the AC voltage applied between the first and second capacitors; and a zero-crossing detecting circuit that is connected to a current path at the rear stage of the rectifier circuit, and detects zero-crossing points of the AC power supply.

9 Claims, 6 Drawing Sheets

(51) Int. Cl.
  *H02M 7/06* (2006.01)
  *H02M 1/00* (2006.01)
  *G01R 19/175* (2006.01)

(52) U.S. Cl.
  CPC ........... *H02M2001/0006* (2013.01); *H02M 2001/007* (2013.01); *H02M 2001/0032* (2013.01); *H02M 2001/0048* (2013.01); *Y02B 70/1491* (2013.01); *Y02B 70/16* (2013.01)

(56) References Cited

U.S. PATENT DOCUMENTS

| | | | |
|---|---|---|---|
| 6,269,012 | B1 | 7/2001 | Kusakabe et al. |
| 6,320,772 | B1* | 11/2001 | Doyama et al. ............... 363/89 |
| 8,606,136 | B2 | 12/2013 | Shimura et al. |
| 2004/0190923 | A1 | 9/2004 | Inukai |
| 2006/0184810 | A1* | 8/2006 | Hamaguchi et al. ......... 713/300 |
| 2006/0209574 | A1* | 9/2006 | Makino ...................... 363/21.12 |
| 2008/0024107 | A1 | 1/2008 | Shin |
| 2010/0019809 | A1 | 1/2010 | Hwang et al. |
| 2011/0019452 | A1 | 1/2011 | Shinomoto et al. |
| 2011/0123208 | A1* | 5/2011 | Inukai ............................. 399/37 |
| 2011/0175712 | A1* | 7/2011 | Franco et al. ............. 340/12.32 |
| 2013/0028623 | A1 | 1/2013 | Inukai |
| 2013/0031396 | A1 | 1/2013 | Inukai |
| 2013/0038318 | A1 | 2/2013 | Inukai |
| 2013/0113292 | A1 | 5/2013 | Inukai |
| 2013/0129373 | A1 | 5/2013 | Inukai |
| 2013/0301316 | A1* | 11/2013 | Ertan ............................. 363/37 |
| 2014/0210264 | A1 | 7/2014 | Inukai |
| 2014/0233266 | A1 | 8/2014 | Inukai et al. |

FOREIGN PATENT DOCUMENTS

| | | |
|---|---|---|
| CN | 201110615 Y | 9/2008 |
| CN | 102081336 A | 6/2011 |
| EP | 2 104 401 A1 | 9/2009 |
| EP | 2 194 637 A1 | 6/2010 |
| EP | 2 551 681 A2 | 1/2013 |
| JP | 55-130543 A | 3/1975 |
| JP | 61-030774 A | 2/1986 |
| JP | 62-091265 A | 6/1987 |
| JP | H07-087734 A | 3/1995 |
| JP | 7-308065 A | 11/1995 |
| JP | H07308065 * | 11/1995 |
| JP | H09-023638 A | 1/1997 |
| JP | 2004-056946 U | 2/2004 |
| JP | 2004-151998 A | 5/2004 |
| JP | 2004-303469 A | 10/2004 |
| JP | 2006-229310 A | 8/2006 |
| JP | 2010-054306 A | 3/2010 |
| JP | 2010-239774 A | 10/2010 |
| JP | 2011-113807 A | 6/2011 |
| JP | 2011-199976 A | 6/2011 |
| JP | 2013-096902 A | 5/2013 |

OTHER PUBLICATIONS

Office Action issued in related Chinese Patent Application No. 201210364448.2 on Jul. 25, 2014.
Office Action issued in related Japanese Patent Application No. 2011-241367 on Nov. 11, 2014.
Office Action issued in related Japanese Patent Application No. 20121-364448.2, mailed Aug. 5, 2015, including English translation.
Office Action issued in related Japanese Patent Application No. 20121-364448.2, mailed Feb. 25, 2015, including English translation.
Chinese Office Action issued in related Chinese Patent Application No. 201310450323.6, mailed Dec. 3, 2015, including English translation.
U.S. Office Action issued in related U.S. Appl. No. 14/038,592, Apr. 25, 2016.
Office Action issued in related Chinese Patent Application No. 20121-364448.2, mailed Aug. 5, 2015, including English translation.
Office Action issued in related Chinese Patent Application No. 20121-364448.2, mailed Feb. 25, 2015, including English translation.
U.S. Office Action (Notice of Allowance) issued in related U.S. Appl. No. 14/038,592, Aug. 23, 2016.

* cited by examiner

POWER SAVING POWER SUPPLY SYSTEM HAVING A LOW-CAPACITY POWER SUPPLY CIRCUIT FOR USE IN AN IMAGE FORMING APPARATUS

CROSS-REFERENCE TO RELATED APPLICATION

This application is based upon and claims the benefit of priority of Japanese Patent Application No. 2011-241367 filed on Nov. 2, 2011, the contents of which are incorporated herein by reference in its entirety.

BACKGROUND

The present disclosure relates to a power supply system, and an image forming apparatus having the power supply system, and a low-capacity power supply circuit, and more particularly, to a technology for detecting the zero-crossing points of an AC voltage.

As an example of a technology for detecting the zero-crossing points (zero-crossings) of an AC voltage, a technology for using a photocoupler to detect the zero-crossing points of an AC voltage is known.

SUMMARY

However, in a method of using the photocoupler to detect zero-crossing points, it is possible to appropriately detect zero-crossing points, but the power consumption of a photodiode of the photocoupler is not negligible. For this reason, a technology for detecting zero-crossing points which can save electric power has been eagerly desired.

An object is to provide a technology for detecting zero-crossing points which can save electric power.

Aspects of the present disclosure provide the following arrangements.

A power supply system comprising:
a switching power supply comprising a controller, the switching power supply being configured to generate a predetermined DC voltage by rectifying and smoothing an AC voltage of an AC power supply;
a control device configured to switch the switching power supply between
a normal mode in which the controller oscillates and the switching power supply generates the predetermined DC voltage, and
a power saving mode in which the controller stops oscillating and the switching power supply stops generating the predetermined DC voltage; and
a low-capacity power supply circuit configured to supply electric power to the control device in the power saving mode, the low-capacity power supply circuit including:
a first capacitor including a first electrode connected to one end of the AC power supply, and a second electrode;
a second capacitor including a first electrode connected to the other end of the AC power supply, and a second electrode;
a rectifier circuit that is electrically connected between the second electrode of the first capacitor and the second electrode of the second capacitor, and is configured to rectify the AC voltage applied between the first electrode of the first capacitor and the first electrode of the second capacitor; and
a zero-crossing detecting circuit that is connected to a current path at a rear stage of the rectifier circuit, and is configured to detect zero-crossing points of the AC power supply on the basis of a rectified current flowing in the current path.

An image forming apparatus comprising:
a power supply system comprising:
a switching power supply comprising a controller, the switching power supply being configured to generate a predetermined DC voltage by rectifying and smoothing an AC voltage of an AC power supply;
a control device configured to switch the switching power supply between
a normal mode in which the controller oscillates and the switching power supply generates the predetermined DC voltage, and
a power saving mode in which the controller stops oscillating and the switching power supply stops generating the predetermined DC voltage; and
a low-capacity power supply circuit configured to supply electric power to the control device in the power saving mode, the low-capacity power supply circuit including:
a first capacitor including a first electrode connected to one end of the AC power supply, and a second electrode;
a second capacitor including a first electrode connected to the other end of the AC power supply, and a second electrode;
a rectifier circuit that is electrically connected between the second electrode of the first capacitor and the second electrode of the second capacitor, and is configured to rectify the AC voltage applied between the first electrode of the first capacitor and the first electrode of the second capacitor; and
a zero-crossing detecting circuit that is connected to a current path at a rear stage of the rectifier circuit, and is configured to detect zero-crossing points of the AC power supply on the basis of a rectified current flowing in the current path; and
an image forming unit driven by the power supply system.

A low-capacity power supply circuit comprising:
a first capacitor including a first electrode connected to one end of the AC power supply, and a second electrode;
a second capacitor including a first electrode connected to the other end of the AC power supply, and a second electrode;
a rectifier circuit that is electrically connected between the second electrode of the first capacitor and the second electrode of the second capacitor, and is configured to rectify an AC voltage applied between the first electrode of the first capacitor and the first electrode of the second capacitor; and
a zero-crossing detecting circuit that is connected to a current path at a rear stage of the rectifier circuit, and is configured to detect zero-crossing points of the AC power supply on the basis of a rectified current flowing in the current path.

According to the aspects of the present disclosure, the rectified current of the low-capacity power supply circuit for saving electric power is significantly smaller than the rectified current of the switching power supply. Therefore, the rectified current flowing in the low-capacity power supply circuit is used to perform zero-crossing detection. As a result, it is possible to perform detection of zero-crossing points capable of saving electric power.

DESCRIPTION OF EXEMPLARY EMBODIMENTS

<First Embodiment>

A first embodiment will be described with reference to FIGS. 1 to 3.

1. Description of Printer

Figure 1:
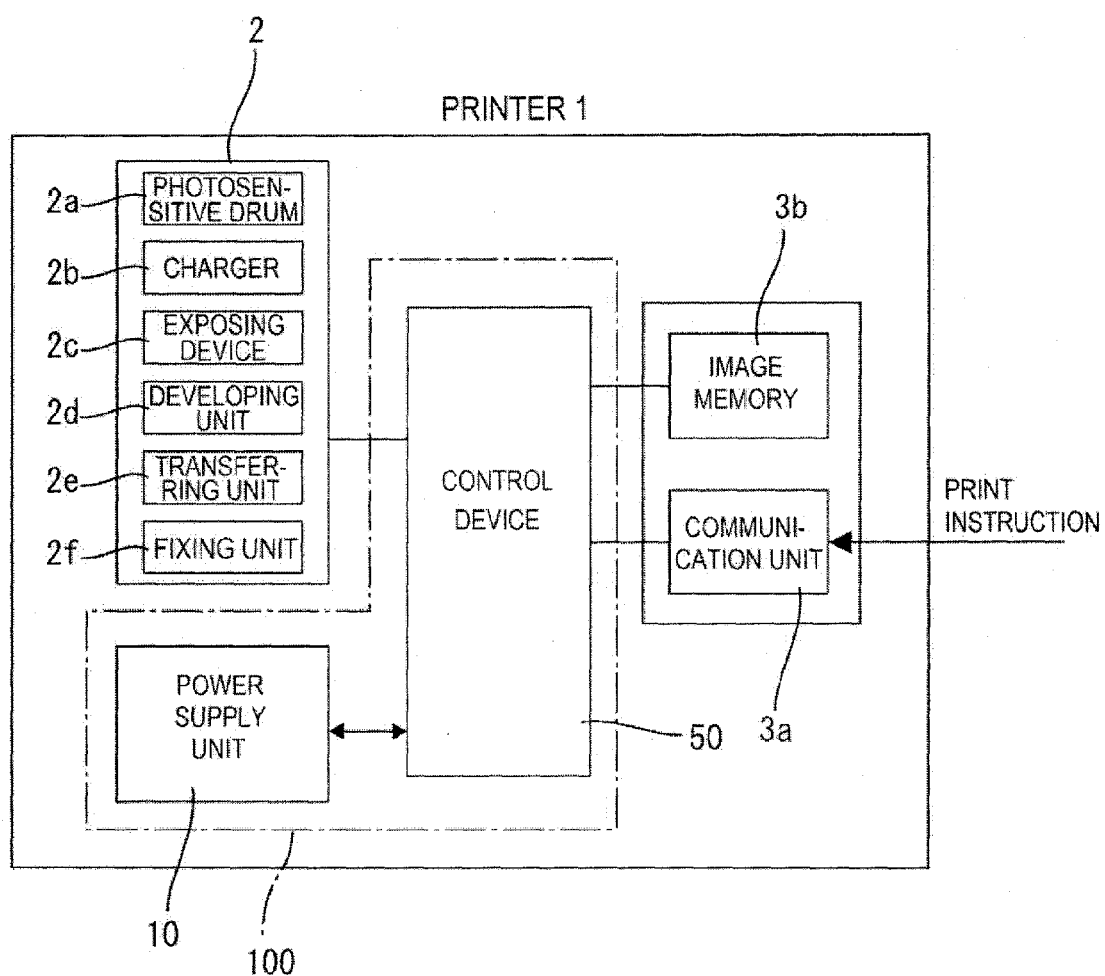
FIG. 1 is a block diagram schematically illustrating the configuration of an image forming apparatus according to a first embodiment.

FIG. 1 is a block diagram illustrating the electrical configuration of a printer 1 which is an example of an image forming apparatus. The printer 1 includes a printing unit 2, a communication unit 3a, an image memory 3b, and a power supply system 100. The power supply system 100 includes a power supply unit 10 and a control device 50. The power supply unit 10 acts as a power supply for the printer 1, and supplies electric power to the printing unit 2, the communication unit 3a, the image memory 3b, and the control device 50.

The printing unit 2 includes a photosensitive drum 2a, a charger 2b for performing a charging process of charging the surface of the photosensitive drum 2a, an exposing device 2c for performing an exposing process of forming an electrostatic latent image on the surface of the photosensitive drum 2a, a developing unit 2d for performing a developing process of attaching a developer to the electrostatic latent image formed on the surface of the photosensitive drum 2a such that a developer image is formed, a transfer unit 2e for performing a transfer process of transferring the developer image onto a recording medium, and a fixing unit 2f for performing a fixing process of fixing the developer image transferred on the recording medium.

The printing unit 2 performs a printing process of performing the charging process, the exposing process, the developing process, the transfer process, and the fixing process so as to print an image based on print data on a recording medium. The communication unit 3a performs communication with an information terminal device such as a PC, and has a function of receiving print instructions and print data from the information terminal device. The image memory 3b temporarily stores print data received from the information terminal device.

If the communication unit 3a receives a print instruction from the information terminal device and receives print data, in the printer 1, the control device 50 controls the printing unit 2 such that the printing unit 2 performs the printing process of performing the charging process, the exposing process, the developing process, the transfer process, and the fixing process so as to print an image based on print data on a recording medium. The operating voltage of the printing unit 2 is generally 24V, whereas the operating voltages of the communication unit 3a, the image memory 3b, and the control device 50 are generally 3.3V.

The printer 1 has a normal mode and a power saving mode, as operation modes. The normal mode is a mode in which the printer 1 is in a state in which the printer 1 can perform the printing process immediately in response to a print instruction or is performing the printing process. Therefore, in the normal mode, the power supply system 100 operates, and thus energization of the fixing unit 2f is controlled such that the fixing unit 2f is maintained at a temperature at which fixing is possible or a temperature slightly lower than the temperature at which fixing is possible. The power saving mode means a mode which the printer 1 enters if any print instruction is not received for a predetermined period, and in which the printer 1 is in a standby state. In the power saving mode, the power supply system 100 operates only partially, and thus the fixing unit 2f cannot be energized.

2. Configuration of Power Supply System

Next, the configuration of the power supply system 100 will be described with reference to FIG. 2. As described above, the power supply system 100 includes the power supply unit 10 and the control device 50. First, the configuration of the power supply unit 10 of the power supply system 100 will be described. The power supply unit 10 includes a switching power supply 20 and a low-capacity power supply circuit 30.

The switching power supply 20 includes a rectifying/smoothing circuit 21, a control IC 22, a voltage generating circuit 23, a transformer 24, a field effect transistor (FET) Q1, a rectifying/smoothing circuit 25, a voltage detecting circuit 26, and DC to DC converters 27 and 28.

In the normal mode, the switching power supply 20 rectifies and smoothes an AC voltage Vac of an AC power supply AC so as to generate DC voltages of +24V, +5V, and +3.3V. The DC voltage of +24V (hereinafter, referred to as DC 24V) is output from a first output terminal OUT1, the DC voltage of +5V (hereinafter, referred to as DC 5V) is output from a second output terminal OUT2, and the DC voltage of +3.3V (hereinafter, referred to as DC 3.3V) is output from a third output terminal OUT3.

The rectifying/smoothing circuit 21 is a so-called capacitor input type, and includes a photodiode for rectifying the AC voltage Vac (for example, 240V) of the AC power supply AC, and a capacitor for smoothing the rectified voltage. An output of the rectifying/smoothing circuit 21 is applied to a primary coil of the transformer 24.

The transistor Q1 is an N-channel MOSFET, and is turned on or off in response to an on/off signal (PWM signal) given to the gate of the transistor Q1 by the control IC 22. Therefore, if the primary side of the transformer 24 oscillates, a voltage is induced at a secondary coil of the transformer 24.

Moreover, on the primary side of the transformer 24, the voltage generating circuit 23 is provided. The voltage generating circuit 23 rectifies and smoothes a voltage induced at an auxiliary coil provided on the primary side of the transformer 24, thereby generating a power supply voltage Vcc for the control IC 22.

The rectifying/smoothing circuit 25 rectifies and smoothes the voltage induced at the secondary coil of the transformer 24, thereby generating DC 24V.

The voltage detecting circuit 26 includes a photocoupler PC1, and makes a light emitting diode LED1 of the photocoupler PC1 emit light in response to the detected level of the DC 24V output of the switching power supply 20. The photocoupler PC1 includes a phototransistor PT1 connected to a feedback port FB of the control IC 22. Therefore, a light signal of the light emitting diode LED 1 is converted into an electric signal by the phototransistor PT1, and the detected value of the DC 24V output is fed back to the feedback port FB of the control IC 22.

The DC to DC converter 27 converts DC 24V into DC 5V and outputs DC 5V, and the DC to DC converter 28 converts DC 24V into DC 3.3V and outputs DC 3.3V.

The control IC 22 controls the on/off signal for the transistor Q1 in response to a control pulse signal Scp input to a control input port EN, such that oscillation of the primary side of the transformer 24 is controlled. In the normal mode, the control IC 22 oscillates the primary side of the transformer 24 such that the DC voltages are generated, and in the power saving mode, the control IC 22 stops output of the on/off signal to the transistor Q1 such that oscillation of the primary side of the transformer 24 stops. In other words, in the power saving mode, the DC voltages of the switching power supply 20 are not output. When the printer 1 returns from the power saving mode to the normal mode, the control pulse signal Scp is input from the control unit 50 to the control input port EN, and thus oscillation of the primary side of the transformer 24 starts in response to the control pulse signal Scp such that the DC voltages are output from the switching power supply 20. In other words, in the normal mode of the printer 1, the switching power supply 20 becomes an output mode, and in the power saving mode of the printer 1, the switching power supply 20 becomes an output stop mode. Also, during activating of the switching power supply 20, a power supply voltage is supplied to an input port VH.

Next, the configuration of the control device 50 of the power supply system 100 will be described. The control device 50 includes an application-specific integrated circuit (ASIC) 51 and a switching power supply control unit 52. The ASIC 51 includes a main block B1 for controlling the printing unit 2 of the printer 1, and a mode control block B2 for mainly controlling the mode of the printer 1. A portion of the mode control may be performed by the main block B1. The main block B1 and the mode control block B2 are not necessarily configured by the ASIC 51. For example, the main block B1 and the mode control block B2 may be configured by a main CPU and a sub CPU.

A power supply port P1 of the main block B1 receives DC 3.3V from the DC to DC converter 28 of the switching power supply 20. The main block B1 can receive power supply to operate only in the normal mode. If the switching power supply 20 transitions to the output stop mode, that is, the power saving mode, the power supply to the main block B1 is cut off so as to stop the main block B1.

The main block B1 includes a timer 55 and a memory 56, and detects the zero-crossing point ZP of the AC voltage Vac of the AC power supply AC (see FIG. 3) on the basis of a pulse signal Pzc input from a zero-crossing detecting circuit 34 to a port P5, as will be described below. Further, the main block B1 generates a zero-crossing signal Szc on the basis of the zero-crossing points ZP (see FIG. 3), and performs, for example, control on the energization of the fixing unit 2f, on the basis of the zero-crossing signal Szc.

The timer 55 is used for time measurement during the detection of the zero-crossing points ZP. The memory 52 includes a ROM and a RAM. The ROM stores various programs to be executed by the ASIC 51, and the RAM stores various kinds of data when the programs are executed.

Meanwhile, a power supply port P2 of the mode control block B2 is connected to a DC-to-DC converter 33 of the low-capacity power supply circuit 30, and receives electric power from the low-capacity power supply circuit 30 in the normal mode and the power saving mode. In response to mode switching of the printer 1, the mode control block B2 switches the switching power supply 20 between the output mode and the output stop mode in which oscillation of the switching power supply 20 stops.

In other words, the mode control block B2 outputs the control pulse signal Scp to the control IC 22, thereby switching the switching power supply 20 between the output mode and the output stop mode. Here, the output mode is a mode in which the primary side of the transformer 24 is made oscillate such that the switching power supply 20 becomes an output state, and corresponds to the normal mode. Meanwhile, the output stop mode is a mode in which the oscillation of the transformer 24 is stopped such that the output of the switching power supply 20 stops, and corresponds to the power saving mode. As described above, in the power saving mode, since the output of the switching power supply 20 stops, the control device 50, that is, the mode control block B2 of the ASIC 51 and a switching-power-supply operation control unit 52 receive power supply from the low-capacity power supply circuit 30.

The switching power supply operation control unit 52 includes a light emitting diode LED2 of a photocoupler PC2 and a transistor Q2. The anode of the light emitting diode LED2 is connected to a power supply line of direct current +3.3V (hereinafter, referred to as DC 3.3VB) from the DC-to-DC converter 33.

The light emitting diode LED2 constitutes a photocoupler PC2, together with a phototransistor PT2 connected to the control input port EN of the control IC 22 of the switching power supply 20. Therefore, if a control pulse signal Scp is output from a control port P3 of the mode control block B2 to the base of the transistor Q2, the control pulse signal Scp is optically transmitted through the photocoupler PC2, and is input to the control input port EN of the control IC 22.

As described above, in a case of switching from the power saving mode to the normal mode, due to electric power supplied from the low-capacity power supply circuit 30, the control unit 50, specifically, the mode control block B2 of the ASIC 51 generates the control pulse signal Scp to restart oscillation of the switching power supply 20, and transmits the control pulse signal Scp to the switching power supply 20. Therefore, it is possible to appropriately perform switching from the power saving mode to the normal mode using electric power accumulated during the power saving mode.

Also, the user can use a switch S1 to instruct the mode control block B2 to perform mode switching.

From a port P4 of the mode control block B2, a control signal Scon is output for turning on or off the DC to DC converter 28 of the switching power supply 20. For example, even in the normal mode, if electric power of DC 3.3VB supplied from the low-capacity power supply circuit 30 is sufficient, the AISC 51 stops the operation of the DC to DC converter 28 of the switching power supply 20 by the control signal Scon.

3. Configuration of Low-capacity Power Supply Circuit

Now, the low-capacity power supply circuit 30 will be described. The low-capacity power supply circuit 30 supplies electric power to the control unit 50 in the power saving mode and the normal mode. Specifically, in each mode, the low-capacity power supply circuit 30 supplies electric power to the mode control block B2 of the control unit 50 and the switching power supply operation control unit 52. In the normal mode, according to the amplitude of the AC voltage Vac, the low-capacity power supply circuit 30 supplies electric power from the AC power supply AC to the control device 50 or supplies electric power from DC 5V of the switching power supply 20 to the control device 50 through a diode D5. In the power saving mode, the low-capacity power supply circuit 30 supplies electric power from a smoothing capacitor C3 to the control device 50. Also, the low-capacity power supply circuit 30 includes a component for detecting the zero-crossing points of the AC power supply AC in the normal mode.

The low-capacity power supply circuit 30 includes a first capacitor C1, a second capacitor C2, a rectifier circuit 31, a zener diode ZD1, the smoothing capacitor C3, the DC to DC converter 33, the pulse generating circuit 34 for zero-crossing detection, and an accumulating capacitor C4.

The first capacitor C1 includes a first electrode C1p1 and a second electrode C1p2, the first electrode C1p1 is connected to one end of the AC power supply AC, and the second electrode C1p2 is connected to the rectifier circuit 31. Also, the second capacitor C2 includes a first electrode C2p1 and a second electrode C2p2, the first electrode C2p1 is connected to the other end of the AC power supply AC, and the second electrode C2p2 is connected to the rectifier circuit 31.

The rectifier circuit 31 is electrically connected between the second electrode C1p2 of the first capacitor C1 and the second electrode of the second capacitor C2, and rectifies the AC voltage Vac applied to the first and second capacitors C1 and C2. In the first embodiment, the rectifier circuit 31 is configured by a bridge circuit composed of four diodes D1, D2, D3, and D4. The cathodes of the diode D1 and the diode D2 are connected at a first contact node Nd1, the anode of the diode D1 is connected to the second electrode C1p2 of the first capacitor C1, and the anode of the diode D2 is connected to the second electrode C2p2 of the second capacitor C2.

Further, the anodes of the diode D3 and the diode D4 are connected at a second contact node Nd2, the cathode of the diode D3 is connected to the second electrode C1p2 of the first capacitor C1, and the cathode of the diode D4 is connected to the second electrode C2p2 of the second capacitor C2. The second contact node Nd2 is connected to a reference potential line Lgd. Also, in the first embodiment, the power supply system 100 is connected to a frame ground. Therefore, the reference potential line Lgd is also grounded such that the potential of the reference potential line Lgd is 0V.

The smoothing capacitor C3 is connected to the rectifier circuit 31, and smoothes the rectified AC voltage so as to generate a smooth voltage Vch. The smoothing capacitor C3 is electrically connected to the DC 5V output terminal (second output terminal) OUT2 of the switching power supply 20 through the diode D5. For this reason, when electric power is supplied to the printer 1, the smoothing capacitor C3 and the accumulating capacitor C4 can be charged in a short time by DC 5V of the switching power supply 20.

The diode D5 is for preventing a backward flow from the smoothing capacitor C3 to the DC to DC converter (27) side. Also, the zener diode ZD1 is for suppressing the smooth voltage Vch from rising in a case where the AC voltage Vac of the AC power supply AC rises.

The DC to DC converter 33 converts the smooth voltage Vch into the DC voltage of +3.3VB. The DC 3.3VB is supplied to a switching-power-supply operation control unit 40 and the power supply port P2 of the mode control block B2. In other words, the mode control block B2 receives power supply from the low-capacity power supply circuit 30.

The accumulating capacitor C4 is charged by DC 3.3VB from the DC to DC converter 33. The charged electric power is used for a drive current of the light emitting diode LED2 of the photocoupler PC2 during switching from the power saving mode to the normal mode. If the capacitances of the smoothing capacitor C3 and the accumulating capacitor C4 are appropriately selected, it is possible to accumulate an amount of electric power according to the needs for a predetermined voltage in the power saving mode. In the first embodiment, the smoothing capacitor C3 and the accumulating capacitor C4 capable of accumulating an amount of electric power to surely drive the light emitting diode LED2 of the photocoupler PC2 are used. Therefore, it is possible to reliably restart the switching power supply 20.

The pulse generating circuit 34 for zero-crossing detection (hereinafter, referred to simply as a pulse generating circuit 34) is connected to a current path IP at the rear stage of the rectifier circuit 31, and detects the zero-crossing points ZP, that is, zero-crossings of the AC power supply AC on the basis of a rectified current Irc flowing in the current path IP. Specifically, the pulse generating circuit 34 generates the pulse signal Pzc for zero-crossing detection (hereinafter, referred to simply as a pulse signal Pzc) corresponding to the zero-crossing points ZP, and the main block B1 of the ASIC 51 finally detects the zero-crossing points ZP on the basis of the pulse signal Pzc. Therefore, the pulse generating circuit 34 for zero-crossing detection and the main block B1 correspond to a zero-crossing detecting circuit.

Figure 2:
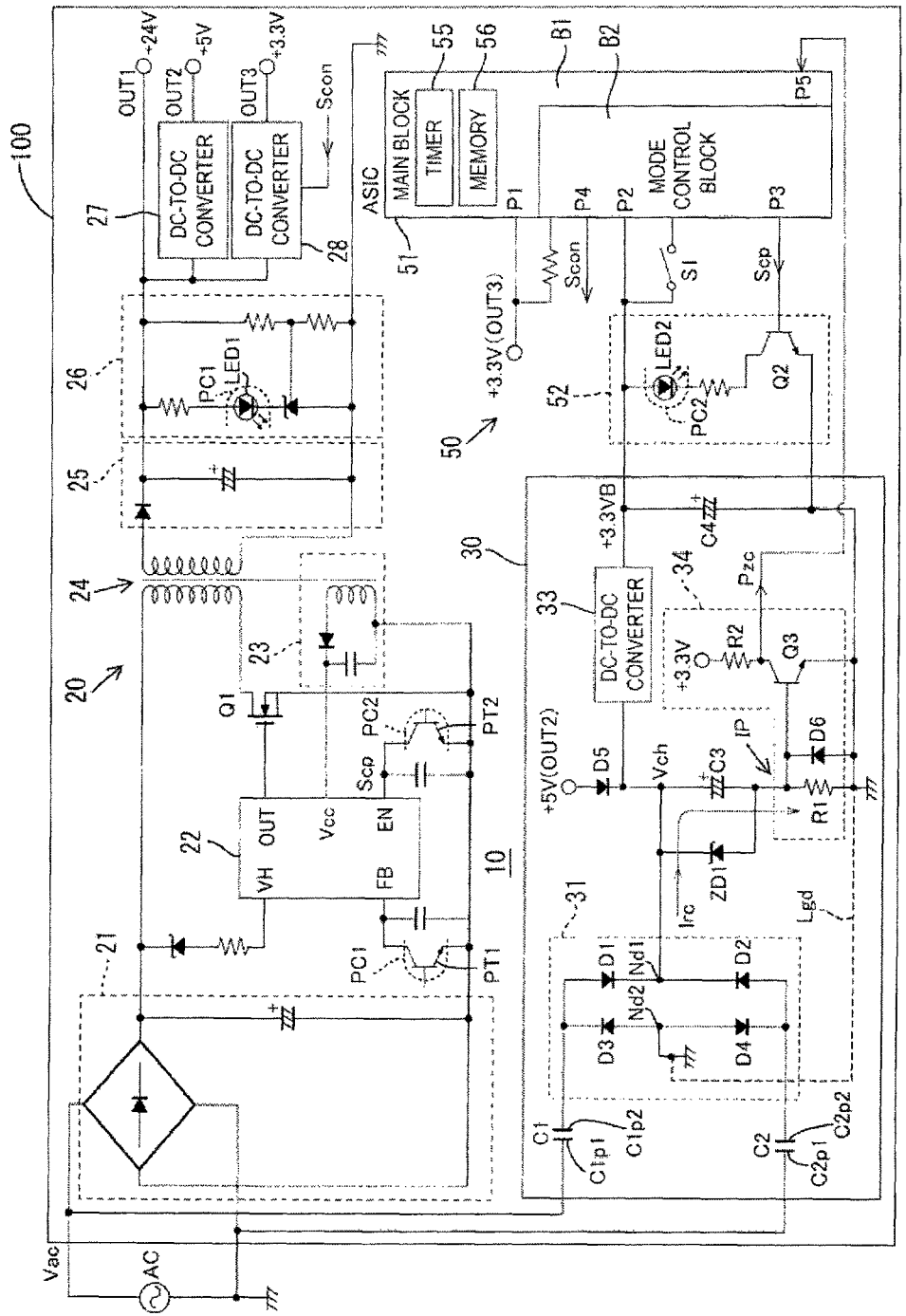
FIG. 2 is a circuit diagram schematically illustrating the configuration of a power supply system according to the first embodiment.

As shown in FIG. 2, the pulse generating circuit 34 includes a resistor R1, a resistor R2, a diode D6, and an NPN transistor (hereinafter, referred to simply as a transistor) Q3.

The current path IP is a path from the first contact node Nd1 of the rectifier circuit 31 to the reference potential line Lgd through the smoothing capacitor C3 and the resistor R1. In other words, the current path IP is a path in which an AC current Iac output from the AC power supply AC flows when the AC current Iac returns to the AC power supply AC.

The transistor Q3 acts as a switching transistor which operates according to a base current generated by the rectified current Irc flowing in the current path IP. In other words, the transistor Q3 converts the rectified current Irc into the pulse signal Pzc.

Specifically, the collector of the transistor Q3 is connected to one end of the resistor R2, the base of the transistor Q3 is connected to the current path IP, and the emitter of the transistor Q3 is connected to the reference potential line Lgd. The resistor R2 is a pull-up resistor, and the other end of the resistor R2 is connected to the DC 3.3V output terminal OUT3 of the DC-to-DC converter 28.

The transistor Q3 is turn on or off in response to the base current supplied to the base. Also, the pulse signal Pzc is output from the collector of the transistor Q3, is 0V when the transistor Q3 is in an ON state, and is 3.3V when the transistor Q3 is in an OFF state. The ASIC 51 detects the pulse period Tp of the pulse signal Pzc, and detects the zero-crossing points ZP of the AC voltage Vac of the AC power supply AC using the pulse period Tp (see FIG. 3).

The transistor Q3 is not limited to a NPN transistor. Also, the configuration for generating the pulse signal Pzc is not necessarily limited to the configuration of the transistor Q3 and the resistor R2. For example, the transistor Q3 may be an FET. In this case, it is preferable to provide a current-to-voltage converter circuit for converting the rectified current Irc into a gate voltage. As the current-to-voltage converter circuit, for example, a voltage follower operational amplifier can be used.

4. Method of Detecting Zero-crossing Points

Now, a method of detecting zero-crossing points will be described with reference to FIG. 3. FIG. 3 shows waveforms in a case where the frequency of the AC power supply AC is 50 Hz, the AC voltage Vac is 240V (effective value), the capacitances of the capacitors C1 and C2 are 3300 pF (picofarads), the forward voltage drops of the diodes D1 to D4 are 0.6 V, a load current is 50 µA, and the zener voltage of the zener diode ZD1 is 8.2 V, the resistance of the resistor R1 is 15 kΩ, and the resistance of the resistor R2 is 10 kΩ.

Figure 3:
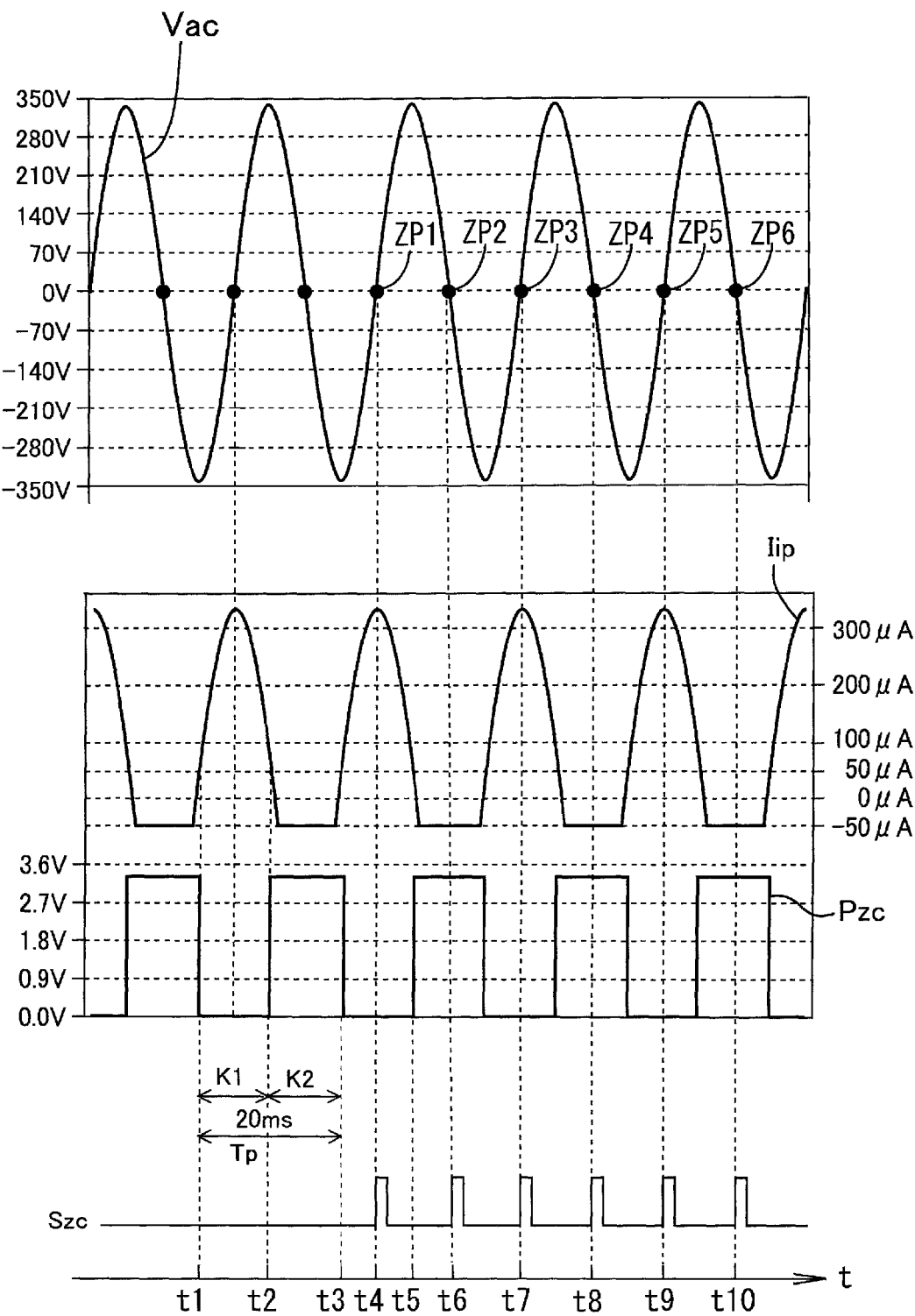
FIG. 3 is a graph illustrating the detection of zero-crossing points according to the first embodiment.

As shown in FIG. 3, as the AC voltage Vac increases, a path current Iip which is the total current of the rectified current Irc (the current flowing in the smoothing capacitor C3) and the zener diode ZD1 increases. At a timing t1 of FIG. 3, the voltage drop of the resistor R1, that is, the voltage between the base and emitter of the transistor Q3 exceeds the turn-on voltage of the transistor Q3 due to the path current Iip, the transistor Q3 is turned on, and the pulse signal Pzc becomes 0V. After the timing t1, according to a change in the AC voltage Vac, the path current Iip further increases. Thereafter, if the path current Iip decreases and thus the voltage drop of the resistor R1 becomes equal to or lower than the turn-on voltage of the transistor Q3 at the timing t2, the pulse signal Pzc becomes about 3.3V.

If the pulse signal Pzc becomes 0V at the timing t1 of FIG. 3, the timer 55 of the ASIC 51 starts to measure a period K1 in which the pulse signal Pzc is 0V (the timing t1 to the timing t2).

Also, if the pulse signal Pzc becomes 3.3V at the timing t2 of FIG. 3, the timer 55 starts to measure a period K2 in which the pulse signal Pzc is 3.3V (the timing t2 to the timing t3). Here, the sum of the period K1 and the period K2, that is, a period from the time t1 to a timing t3 corresponds to the pulse period Tp of the pulse signal Pzc, and the timer 55 detects the pulse period Tp of the pulse signal Pzc. Next, the ASIC 51 detects a zero-crossing point ZP1 on the basis of the pulse period Tp of the pulse signal Pzc. In the first embodiment, the pulse period Tp becomes 20 ms (milliseconds) which is the same as the period of the AC voltage Vac.

In a case where the pulse period Tp is the sum of the periods K1 and K2, the ASIC 51 calculates a timing t4 of the zero-crossing point ZP1 shown in FIG. 3 by the following Equation 1.

$$t4 = t3 + (K1/2) \quad \text{Equation 1}$$

Figure 5:
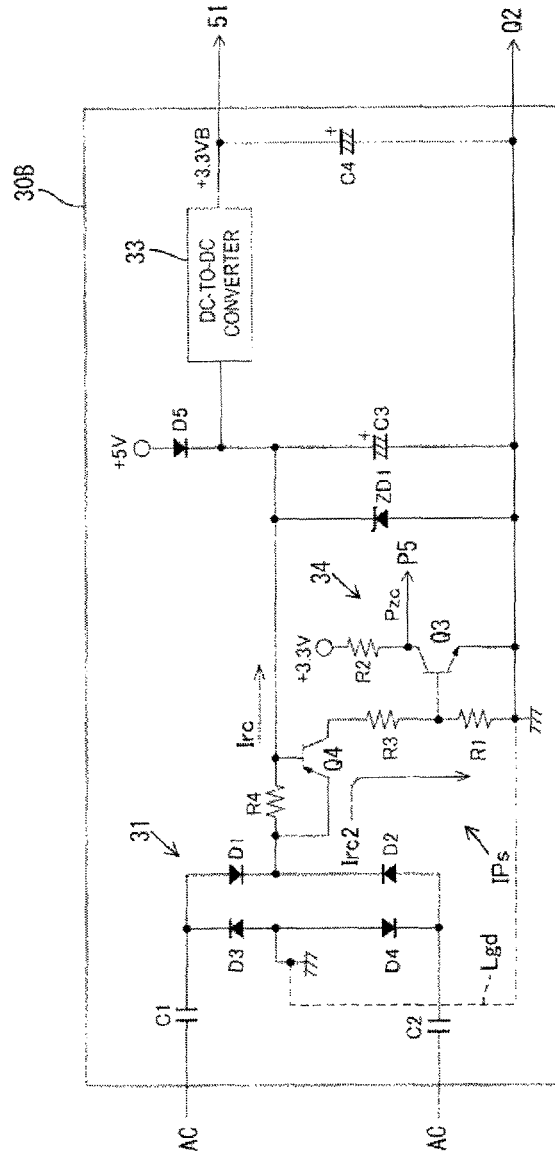
FIG. 5 is a circuit diagram illustrating the configuration of a low-capacity power supply circuit according to a third embodiment.

Further, the ASIC 51 calculates a timing t6 of a zero-crossing point ZP2 shown in FIG. 5 by the following Equation 2.

$$t6 = t5 + (K2/2) \quad \text{Equation 2}$$

Here, the timings t1 and t3 of FIG. 3 are falling timings of the pulse signal Pzc, and the timings t2 and t5 of FIG. 3 are rising timings of the pulse signal Pzc. Therefore, it can be said that the ASIC 51 detects the zero-crossing points ZP on the basis of the rising timings and falling timings of the pulse signal Pzc.

In the same way, the ASIC 51 calculates timings t7 to t10 of zero-crossing points ZP3 to ZP6. Next, the ASIC 51 generates the zero-crossing signal Szc which rises at the times t4, and t6 to t10 of the zero-crossing points ZP1 to ZP6, for example, and performs, for example, control on energization of the fixing unit 7, on the basis of the zero-crossing signal Szc.

5. Effects of First Embodiment

The pulse generating circuit 34 constituting the zero-crossing detecting circuit is provided in the low-capacity power supply circuit 30 which is used in the power saving mode, and the rectified current Irc of the low-capacity power supply circuit 30 is used to perform the zero-crossing detection. The rectified current Irc of the low-capacity power supply circuit 30 is significantly lower than the rectified current of the switching power supply 20. For this reason, the rectified current Irc flowing in the low-capacity power supply circuit 30 is used to perform the zero-crossing detection. Therefore, it is possible to perform zero-crossing detection capable of saving electric power. In addition, the amount of consumed electric power for the zero-crossing detection of the first embodiment is about 80 µW, which is significantly smaller than that of zero-crossing detection using a photocoupler according to the related art.

Also, the pulse generating circuit 34 (an example of a zero-crossing detecting circuit) is connected to the current path IP connecting the smoothing capacitor C3 and the reference potential line Lgd. This current path IP is necessary for generating the predetermined smooth voltage Vch. For this reason, it is possible to use an originally necessary path, without newly providing a current path dedicated for zero-crossing detection.

<Second Embodiment>

Figure 4:
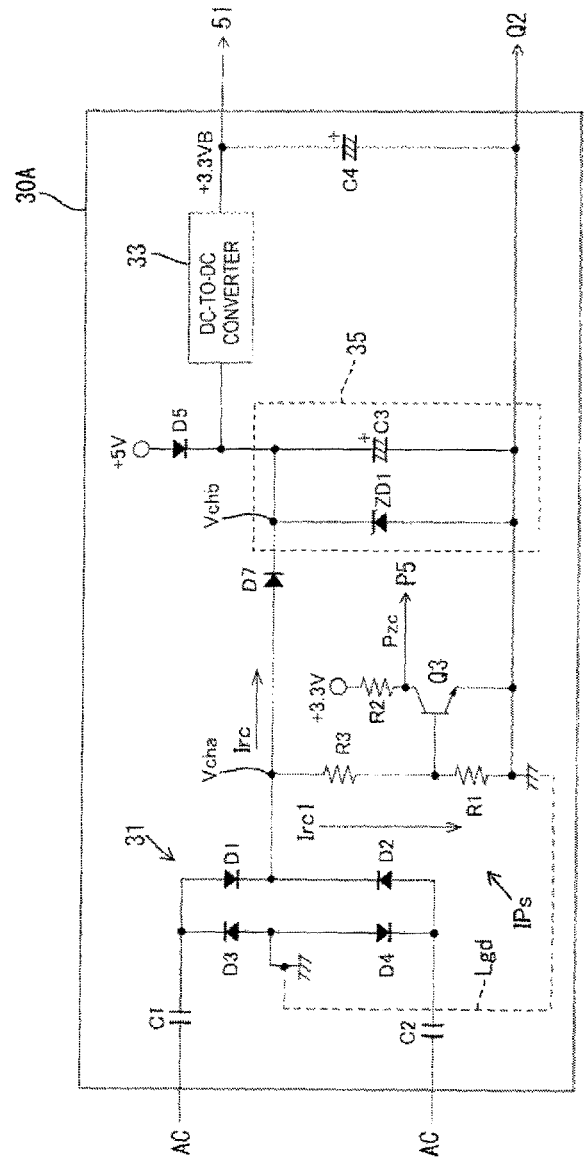
FIG. 4 is a circuit diagram illustrating the configuration of a low-capacity power supply circuit according to a second embodiment.

Now, a second embodiment of the power supply system 100 will be described with reference to FIG. 4. FIG. 4 shows the configuration of a low-capacity power supply circuit 30A according to the second embodiment. The power supply system 100 of the second embodiment is different from the power supply system 100 of the first embodiment only in the current path on which the pulse generating circuit 34 is provided in the low-capacity power supply circuit. Therefore, this difference will be described, but the same components will not be described.

In the second embodiment, the pulse generating circuit 34 (an example of the zero-crossing detecting circuit) is connected to a dedicated current path IPs dividing the rectified current Irc. Specifically, as shown in FIG. 4, the dedicated current path IPs is composed of two voltage dividing resistors R1 and R3 connected in series, and is disposed in parallel with the smoothing capacitor C3 between the rectifier circuit 31 and the smoothing capacitor C3. Also, the pulse generating circuit 34 is connected between the two voltage dividing resistors R1 and R3. Specifically, the base of the transistor Q3 of the pulse generating circuit 34 is connected between the two voltage dividing resistors R1 and R3. Then, the transistor Q3 is turned on or off according to a divided current Irc1 of the rectified current Irc, and zero-crossing detection is performed similarly to the first embodiment.

In this configuration, a smoothing circuit 35 and the pulse generating circuit 34 for zero-crossing detection are separated from each other by a diode D7, and the zero-crossings are detected by a half-wave rectified voltage Vcha. Thereafter, the half-wave rectified voltage Vcha is smoothened to be a smooth voltage Vchb. Therefore, the smooth voltage is stabler as compared to the first embodiment, and thus +3.3VB generated by the DC-to-DC converter 33 is stabler.

<Third Embodiment>

Now, a third embodiment of the power supply system 100 will be described with reference to FIG. 4. FIG. 5 shows the configuration of a low-capacity power supply circuit 30B according to the third embodiment. Like the first embodiment, the power supply system 100 of the third embodiment is different from the power supply system 100 of the first embodiment only in the current path on which the pulse generating circuit 34 is provided in the low-capacity power supply circuit. Therefore, this difference will be described, but the same components will not be described.

In the third embodiment, like in the second embodiment, the pulse generating circuit 34 (an example of the zero-crossing detecting circuit) is connected to a dedicated current path IPs. Specifically, as shown in FIG. 5, a resistor R4 is connected between the rectifier circuit 31 and the smoothing capacitor C3. The dedicated current path IPs is composed of a transistor Q4 (an example of a switch circuit) that is turned on or off according to the voltage drop of the resistor R4, and two voltage dividing resistors R1 and R3 connected between the transistor Q4 and the reference potential line Lgd. Also, the pulse generating circuit 34 is connected between the two voltage dividing resistors R1 and R3. Specifically, the base of the transistor Q3 of the pulse generating circuit 34 is connected between the two voltage dividing resistors R1 and R3.

In this configuration, only when the rectified current Irc is equal to or larger than a predetermined current (the voltage drop of the resistor R4 is equal to or greater than a predetermined value), the transistor Q4 is turned on, and zero-crossing detection is performed on the basis of a divided current Irc2 of the rectified current Irc. As described above, only when the rectified current Irc is equal to or larger than the predetermined current, the zero-crossing detection is performed. Therefore, the reliability of the zero-crossing detection is improved.

<Other Embodiments>

The present invention is not limited to the embodiments described with reference to the drawings, but, for example, the following embodiments are included in the technical scope of the present invention.

(1) In the first embodiment, the zener diode ZD1 and the smoothing capacitor C3 are provided. However, the present invention is not limited thereto. Any one of the zener diode ZD1 and the smoothing capacitor C3 may be provided. Even in this case, the zero-crossing detecting circuit 34 can detect the zero-crossing points of the AC power supply on the basis of the rectified current Irc flowing in the current path IP.

Also, in a case where the smoothing capacitor C3 is provided, it is preferable to provide at least one of the resistor R1 and the diode D6.

(2) In the second embodiment and the third embodiment, in a case where the DC-to-DC converter 33 and the accumulating capacitor C4 are provided, the zener diode ZD1 and the smoothing capacitor C3 may be omitted.

(3) In each of the above-mentioned embodiments, in a case where the pulse signal (corresponding to a zero-crossing pulse) Pzc cannot be detected, the control device 50, specifically, the main block B1 of the ASIC 51 may determine that the voltage Vac of the AC power supply AC has dropped or the AC power supply AC has been suddenly turned off, and generate a power failure signal. This is because in the case where the pulse signal Pzc cannot be detected, it is possible to detect the voltage drop of the AC power supply AC or that the AC power supply AC is in an OFF state. In this case, it is possible to appropriately cope with occurrence of a power failure.

(4) In each of the above-mentioned embodiments, in a case where the period K1 (corresponding to a pulse width) of the zero-crossing signal (corresponding to the zero-crossing pulse) Pzc is shorter than a predetermined period, the control device 50, specifically, the main block B1 of the ASIC 51 may determine that a rectangular wave has been input from the AC power supply AC, and generate a rectangular-wave power failure signal.

This is because of the following reason. In a case where the waveform of the AC power supply AC is rectangular, the period K1 of the pulse signal Pzc becomes significantly short. For this reason, the period K1 is compared to a predetermined period for detecting a rectangular wave, and if the period K1 is shorter than the predetermined period, it is possible to detect that a rectangular wave has been input from the AC power supply AC. In other words, on the basis of the period K1 of the pulse signal Pzc, it is possible to detect the zero-crossing points ZP on the basis of the period K1 of the pulse signal Pzc and to detect the waveform failure of the AC power supply AC. Therefore, it is possible to appropriately cope with the case where a rectangular wave has been input from the AC power supply.

(5) In each of the above-mentioned embodiments, the smoothing capacitor C3 is connected to the DC 5V output terminal (OUT2) of the switching power supply 20 through the diode D5. However, this configuration is not necessary needed and thus may be omitted. In other words, the smoothing capacitor C3 may not be connected to the second output terminal OUT2 of the switching power supply 20.

(6) In each of the above-mentioned embodiments, the zener diode ZD1 which is a constant voltage circuit is not necessarily needed, and thus may be omitted. Also, the DC-to-DC converter 33 and the accumulating capacitor C4 are not necessarily needed, and thus may be omitted. In this case, the drive current of the light emitting diode LED2 of the photocoupler PC2 is supplied from the smoothing capacitor C3.

Figure 6:
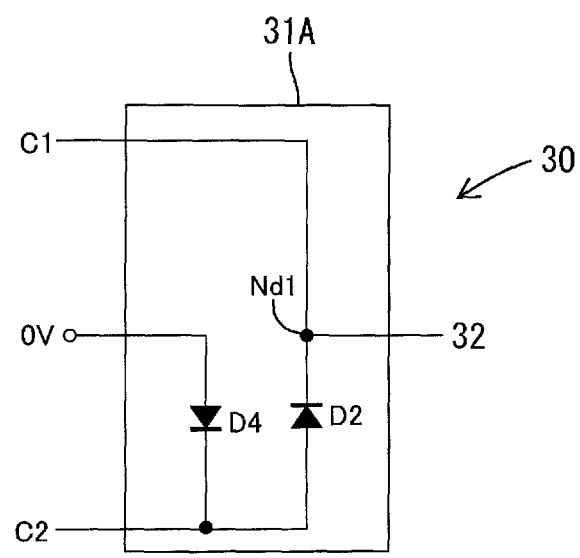
FIG. 6 is a circuit diagram illustrating a rectifier circuit.

(7) In each of the above-mentioned embodiments, the configuration of the rectifier circuit 31 is composed of the four diodes D1 to D4 shown in FIG. 2 or the like. However, the present invention is not limited thereto. For example, like the rectifying circuit 31A shown in FIG. 6, the rectifier circuit 31 may be composed two diodes D2 and D4.

(8) In each of the above-mentioned embodiments, the reference potential line Lgd is grounded. However, the present invention is not limited thereto. The present invention can be applied even to a case where reference potential line Lgd is not grounded.

(9) In each of the above-mentioned embodiments, the power supply system 100 disclosed in this specification is applied to an image forming apparatus. However, the present invention is not limited thereto. The power supply system 100 can be applied to any apparatuses having a normal mode and a power saving mode.

What is claimed is:
1. A power supply system comprising:
a switching power supply comprising a controller, the switching power supply being configured to generate a predetermined DC voltage by rectifying and smoothing an AC voltage of an AC power supply;
a control device configured to switch the switching power supply between a normal mode in which the switching power supply generates the predetermined DC voltage, and a power saving mode in which the switching power supply stops generating the predetermined DC voltage; and
a low-capacity power supply circuit configured to supply electric power to the control device in the power saving mode, the low-capacity power supply circuit including:
a first capacitor including a first electrode connected to one end of the AC power supply, and a second electrode;
a second capacitor including a first electrode connected to the other end of the AC power supply, and a second electrode;
a rectifier circuit that is electrically connected between the second electrode of the first capacitor and the second electrode of the second capacitor, and is configured to:
rectify the AC voltage applied between the first electrode of the first capacitor and the first electrode of the second capacitor; and
supply a rectified current;

a zero-crossing detecting circuit that is connected to a current path at a rear stage of the rectifier circuit, and is configured to:
    detect zero-crossing points of the AC power supply on the basis of the rectified current received from the rectifier circuit; and
    generate a signal based on the detected zero-crossing points; and
a DC-to-DC converter that is connected to the current path at the rear stage of the rectifier circuit, and is configured to generate a predetermined DC voltage by converting a DC voltage received from the rectifier circuit;
wherein the zero-crossing detecting circuit includes a transistor and the rectifier circuit includes first and second output terminals,
wherein the first output terminal of the rectifier circuit, a third capacitor and a base of the transistor are connected in series, and the third capacitor is provided between the first output terminal of the rectifier circuit and the base of the transistor,
wherein the second output terminal of the rectifier circuit and the emitter of the transistor are both connected to a reference potential line, and the collector of the transistor is connected to, via a pull-up resistor, the switching power supply, and
wherein a current path is formed from the first output terminal of the rectifier circuit to the reference potential line through the third capacitor and a resistor; the third capacitor is connected to the rectifier circuit, and smooths the rectified AC voltage so as to generate a smooth voltage which is supplied to an input terminal of the DC-to-DC converter; the base of the transistor is connected between the third capacitor and the resistor to the current path, and the transistor acts as a switching transistor which operates according to a base current generated by the rectified current flowing in the current path.

2. The power supply system according to claim 1, wherein the low-capacity supply circuit further includes a smoothing capacitor and a current path connecting the smoothing capacitor to a reference potential line, and the zero-crossing detecting circuit is connected to the current path.

3. The power supply system according to claim 1, wherein the low-capacity power supply circuit further comprises a dedicated current path connected to the rectifier circuit, and the zero-crossing detecting circuit is connected to the dedicated current path.

4. The power supply system according to claim 3, wherein the low-capacity power supply circuit further comprises a smoothing capacitor, the dedicated current path includes two voltage dividing resistors connected in series, the dedicated current path is connected in parallel with the smoothing capacitor and arranged between the rectifier circuit and the smoothing capacitor, and the zero-crossing detecting circuit is connected between the two voltage dividing resistors.

5. The power supply system according to claim 3 further comprising a resistor connected between the rectifier circuit and the smoothing capacitor, wherein the dedicated current path includes a switch circuit that is turned on and off according to a voltage drop of the resistor, and two voltage dividing resistors connected between the switch circuit and a reference potential line, and wherein the zero-crossing detecting circuit is connected between the two voltage dividing resistors.

6. The power supply system according to claim 1, wherein the zero-crossing detecting circuit detects a zero-crossing pulse corresponding to the zero-crossing points, and detects the zero-crossing points on the basis of the zero-crossing pulse, and if the zero-crossing detecting circuit cannot detects the zero-crossing pulse, the control device determines that the voltage of the AC power supply has dropped, or the AC power supply has suddenly turned off, and the control device generates a power failure signal.

7. The power supply system according to claim 1, wherein the zero-crossing detecting circuit detects a zero-crossing pulse corresponding to the zero-crossing points, and detects the zero-crossing points on the basis of the zero-crossing pulse, and if the pulse width of the zero-crossing pulse is shorter than a predetermined pulse width, the control device determines that a rectangular wave has been input from the AC power supply, and generates a rectangular-wave power failure signal.

8. An image forming apparatus comprising:
a power supply system comprising:
    a switching power supply comprising a controller, the switching power supply being configured to generate a predetermined DC voltage by rectifying and smoothing an AC voltage of an AC power supply;
    a control device configured to switch the switching power supply between a normal mode in which the switching power supply generates the predetermined DC voltage, and a power saving mode in which the switching power supply stops generating the predetermined DC voltage; and
    a low-capacity power supply circuit configured to supply electric power to the control device in the power saving mode, the low-capacity power supply circuit including:
        a first capacitor including a first electrode connected to one end of the AC power supply, and a second electrode;
        a second capacitor including a first electrode connected to the other end of the AC power supply, and a second electrode;
        a rectifier circuit that is electrically connected between the second electrode of the first capacitor and the second electrode of the second capacitor, and is configured to:
            rectify the AC voltage applied between the first electrode of the first capacitor and the first electrode of the second capacitor; and
            supply a rectified current;
        a zero-crossing detecting circuit that is connected to a current path at a rear stage of the rectifier circuit, and is configured to:
            detect zero-crossing points of the AC power supply on the basis of the rectified current received from the rectifier circuit; and
            generate a signal based on the detected zero-crossing points;
    an image forming unit driven by the power supply system; and
    a DC-to-DC converter that is connected to the current path at the rear stage of the rectifier circuit, and is configured to generate a predetermined DC voltage by converting a DC voltage received from the rectifier circuit;
wherein the zero-crossing detecting circuit includes a transistor and the rectifier circuit includes first and second output terminals,
wherein the first output terminal of the rectifier circuit, a third capacitor and a base of the transistor are connected in series, and the third capacitor is provided between the first output terminal of the rectifier circuit and the base of the transistor, wherein the second output terminal of the rectifier circuit and the emitter of the transistor are both connected to a reference potential line, and the collector of the transistor is connected to, via a pull-up resistor, the switching power supply, and wherein a current path is formed from the first output terminal of the rectifier circuit to the reference potential line through the third capacitor and a resistor; the third capacitor is connected to the rectifier circuit, and smooths the rectified AC voltage so as to generate a smooth voltage which is supplied to an input terminal of the DC-to-DC converter; the base of the transistor is connected between the third capacitor and the resistor to the current path, and the transistor acts as a switching transistor which operates according to a base current generated by the rectified current flowing in the current path.

9. A low-capacity power supply circuit comprising:
a first capacitor including a first electrode connected to one end of the AC power supply, and a second electrode;
a second capacitor including a first electrode connected to the other end of the AC power supply, and a second electrode;
a rectifier circuit that is electrically connected between the second electrode of the first capacitor and the second electrode of the second capacitor, and is configured to:
    rectify the AC voltage applied between the first electrode of the first capacitor and the first electrode of the second capacitor; and
    supply a rectified current;
a zero-crossing detecting circuit that is connected to a current path at a rear stage of the rectifier circuit, and is configured to:
    detect zero-crossing points of the AC power supply on the basis of the rectified current received from the rectifier circuit; and
    generate a signal based on the detected zero-crossing points; and
a DC-to-DC converter that is connected to the current path at the rear stage of the rectifier circuit, and is configured to generate a predetermined DC voltage by converting a DC voltage received from the rectifier circuit wherein the zero-crossing detecting circuit includes a transistor and the rectifier circuit includes first and second output terminals, wherein the first output terminal of the rectifier circuit, a third capacitor and a base of the transistor are connected in series, and the third capacitor is provided between the first output terminal of the rectifier circuit and the base of the transistor, wherein the second output terminal of the rectifier circuit and the emitter of the transistor are both connected to a reference potential line, and the collector of the transistor is connected to, via a pull-up resistor, the switching power supply, and wherein a current path is formed from the first output terminal of the rectifier circuit to the reference potential line through the third capacitor and a resistor; the third capacitor is connected to the rectifier circuit, and smooths the rectified AC voltage so as to generate a smooth voltage which is supplied to an input terminal of the DC-to-DC converter; the base of the transistor is connected between the third capacitor and the resistor to the current path, and the transistor acts as a switching transistor which operates according to a base current generated by the rectified current flowing in the current path.

* * * * *